(12) United States Patent
Sato

(10) Patent No.: US 11,102,437 B2
(45) Date of Patent: Aug. 24, 2021

(54) MEMORY CIRCUIT AND SEMICONDUCTOR DEVICE

(71) Applicant: SAMSUNG ELECTRONICS CO., LTD., Suwon-si (KR)

(72) Inventor: Tomohiko Sato, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 16/666,058

(22) Filed: Oct. 28, 2019

(65) Prior Publication Data

US 2020/0162689 A1    May 21, 2020

(30) Foreign Application Priority Data

Nov. 20, 2018 (JP) .............................. JP2018-217083
Jul. 23, 2019 (KR) ......................... 10-2019-0088855

(51) Int. Cl.
| | | |
|---|---|---|
| *H04N 5/378* | (2011.01) | |
| *G11C 11/419* | (2006.01) | |
| *H04N 5/3745* | (2011.01) | |
| *G11C 11/418* | (2006.01) | |

(52) U.S. Cl.
CPC ........... *H04N 5/378* (2013.01); *G11C 11/418* (2013.01); *G11C 11/419* (2013.01); *H04N 5/37452* (2013.01); *H04N 5/37455* (2013.01)

(58) Field of Classification Search
CPC ....... G11C 11/419; G11C 11/418; G11C 7/16; G11C 7/1018; G11C 8/04; G11C 8/10; G11C 5/02; G11C 5/063; G11C 7/18; G11C 8/14; H04N 5/378; H04N 5/37452; H04N 5/37455; H04N 5/374
See application file for complete search history.

(56) References Cited

U.S. PATENT DOCUMENTS

| | | | |
|---|---|---|---|
| 2003/0137865 A1* | 7/2003 | Thompson | G11C 7/06 365/145 |
| 2009/0027533 A1* | 1/2009 | Itakura | H04N 5/235 348/308 |
| 2009/0116271 A1* | 5/2009 | Yamada | G11C 8/14 365/51 |
| 2012/0292485 A1 | 11/2012 | Kasuga et al. | |
| 2013/0002914 A1 | 1/2013 | Koyama | |
| 2016/0156865 A1 | 6/2016 | Hayashi et al. | |

FOREIGN PATENT DOCUMENTS

| | | |
|---|---|---|
| JP | 2011-166350 A | 8/2011 |
| JP | 2013-012966 A | 1/2013 |
| JP | 2016-103809 A | 6/2016 |

* cited by examiner

*Primary Examiner* — Timothy J Henn
(74) *Attorney, Agent, or Firm* — Volentine, Whitt & Francos, PLLC

(57) ABSTRACT

A memory circuit includes a memory array, a word line, and a bit line. The memory array includes a plurality of memories arranged in a matrix shape in a first direction and a second direction perpendicular to the first direction. The word line extends in the first direction and reads signals from the plurality of memories arranged in the first direction. The bit line includes a digit line connected to the plurality of memories arranged in the second direction and an output line connected to the digit line and extending in the first direction and transmits a signal from a memory corresponding to the word line to the output line as the word line reads a signal.

20 Claims, 9 Drawing Sheets

MEMORY CIRCUIT AND SEMICONDUCTOR DEVICE

CROSS-REFERENCE TO RELATED APPLICATIONS

This application claims priority under 35 U.S.C. § 119 to Japan Patent Application No. 2018-217083 filed on Nov. 20, 2018, in the Japan Patent Office and Korean Patent Application No. 10-2019-0088855 filed on Jul. 23, 2019, in the Korean Patent Office, the disclosures of which are incorporated by reference herein in their entireties.

BACKGROUND

Embodiments of the disclosure described herein relate to a memory circuit, a semiconductor device, and a mobile device.

Nowadays, there is a demand on the miniaturization of an image sensor mounted on a mobile device, together with the high integration of the image sensor. It is necessary to implement a peripheral circuit efficiently for the purpose of miniaturizing the image sensor.

For example, a first patent document (JP2016-103809A) proposes an imaging device including a selection part that commonly selects a bit memory storing a signal of a given bit from among a plurality of bit memories, in a memory part of each of a plurality of analog-to-digital (AD) conversion parts. A second patent document (JP2013-012966A) proposes a technique that includes a latch circuit including latch units each storing a signal of each bit of digital signals of a digital signal output circuit, and a switch disposed to correspond to each of the latch units and transmitting a digital signal stored in the corresponding latch unit to a corresponding latch unit in an adjacent latch circuit.

In the technologies disclosed in the first patent document and the second patent document, a word line is disposed to cross a plurality of bit lines in a horizontal direction upon reading a signal from a memory circuit that latches a signal after AD conversion. This word line is used to read a bit of the same digit from among signals obtained from a plurality of pixel arrays. For this reason, in the technologies disclosed in the first patent document and the second patent document, there is required a signal output circuit that again arranges and outputs signals thus read.

SUMMARY

Embodiments of the disclosure provide a semiconductor device suppressing an increase in the area of a signal output circuit.

A memory circuit according to the disclosure includes a memory array, a word line, and a bit line. The memory array includes a plurality of memories arranged in a matrix shape in a first direction and a second direction perpendicular to the first direction. The word line extends in the first direction and makes it possible to read signals from the plurality of memories arranged in the first direction. The bit line includes a digit line connected to the plurality of memories arranged in the second direction and an output line connected to the digit line and extending in the first direction and transmits a signal from a memory corresponding to the word line to the output line by making it possible to read a signal by the word line.

According to the above configuration, because the word line and the bit line are disposed in parallel, the memory circuit may read the most significant bit (MSB) to the least significant bit (LSB) as one word. Accordingly, a circuit for arranging data after signals are read from the memory array is not required.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Figure 1:
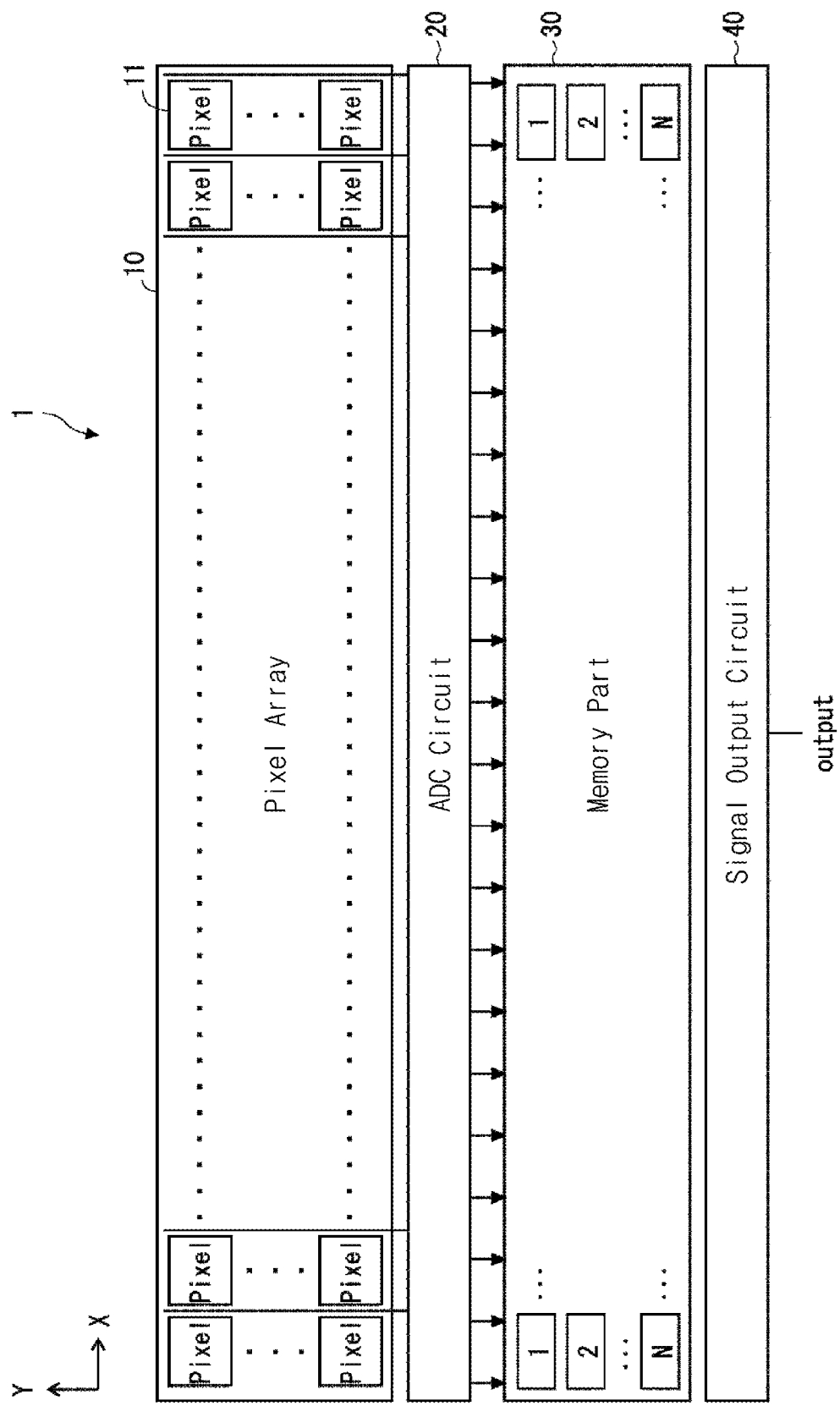
FIG. 1 is a schematic configuration diagram of a semiconductor device according to a first embodiment.

Below, descriptions and drawings will be appropriately omitted and simplified to make the description clear. In the drawings, the same element may be marked by the same sign, and a description thereof will be omitted if necessary.

First Embodiment

Below, a first embodiment will be described with reference to the accompanying drawings. FIG. 1 is a schematic configuration diagram of a semiconductor device according to a first embodiment. A semiconductor device 1 is an image sensor that includes an optical lens forming an image of a subject and is used as an imaging device. The semiconductor device 1 includes a pixel array 10, an analog-digital-converter (ADC) circuit 20, a memory part 30, and a signal output circuit 40.

For ease of description, FIG. 1 uses a two-dimensional orthogonal coordinate system. An X-axis is parallel to a horizontal direction of the drawing, and a right direction of the drawing is a positive direction of the X-axis. A Y-axis is parallel to a vertical direction of the drawing, and an upward direction of the drawing is a positive direction of the Y-axis. The Y-axis direction may be referred to as a "first direction" and the X-axis direction may be referred to as a "second direction".

The pixel array 10 includes photoelectric conversion elements 11 arranged in the form of a matrix. Each of the photoelectric conversion elements 11 generates an analog signal from a detected light and supplies the analog signal to the ADC circuit 20.

The ADC circuit 20 performs analog-to-digital (AD) conversion on analog signals from the pixel array 10. The ADC circuit 20 is, for example, a single slope ADC. A digital signal (called a "binary signal") converted through the ADC circuit 20 includes bits (e.g., 8 bits, 10 bits, or 12 bits), the number of which is determined in advance. The ADC circuit 20 supplies the binary signal to the memory part 30.

The memory part 30 may be a memory device that stores a signal received from the ADC circuit 20 in the unit of a bit and may include, for example, a static random-access memory (SRAM). The memory part 30 may include a memory array in which unit memories, each storing a signal in the unit of a bit, are arranged in the form of a matrix.

In the first embodiment, the memory array includes "N" memories from a first bit to an N-th bit in the Y-axis direction. Here, "N" indicates the number of bits of a discrete binary signal obtained through the AD conversion. That is, the ADC circuit 20 converts an analog signal received from the pixel array 10 into an N-bit binary signal. Below, in the specification, a discrete binary signal obtained by performing AD conversion on an analog signal of any photoelectric conversion element 11 is referred to as a "binary signal of a one-word quantity". For example, in the case where the AD-converted binary signal is a 10-bit signal, the memory part 30 includes 10 memories arranged in the Y-axis direction for the binary signal of the one-word quantity. That is, in this case, "N" is 10.

The memory array includes memories as much as the number of pixels arranged in the X-axis direction. Accordingly, the memory part 30 includes, for example, thousands of memories arranged in the X-axis direction. Each of the memories arranged in the X-axis direction stores a bit of a binary signal, which corresponds to the same digit.

The memory part 30 may store binary signals from the ADC circuit 20 in memories and simultaneously supplies the binary signals to the signal output circuit 40 under control of a memory controller (not illustrated).

The signal output circuit 40 outputs the binary signals from the memory part 30 to a different circuit. The signal output circuit 40 outputs the binary signals in turn in the order of arrangement of the photoelectric conversion elements 11 such that the different circuit appropriately processes signals.

The semiconductor device 1 may be used, for example, in a mobile device, such as a smartphone or a digital camera, together with an optical lens. The optical lens forms an image of a subject on the pixel array 10, and the semiconductor device 1 converts the formed image of the subject into an electrical signal. The semiconductor device 1 converts the electrical signal into a binary signal and outputs the converted binary signal to a different circuit in the mobile device.

Figure 2:
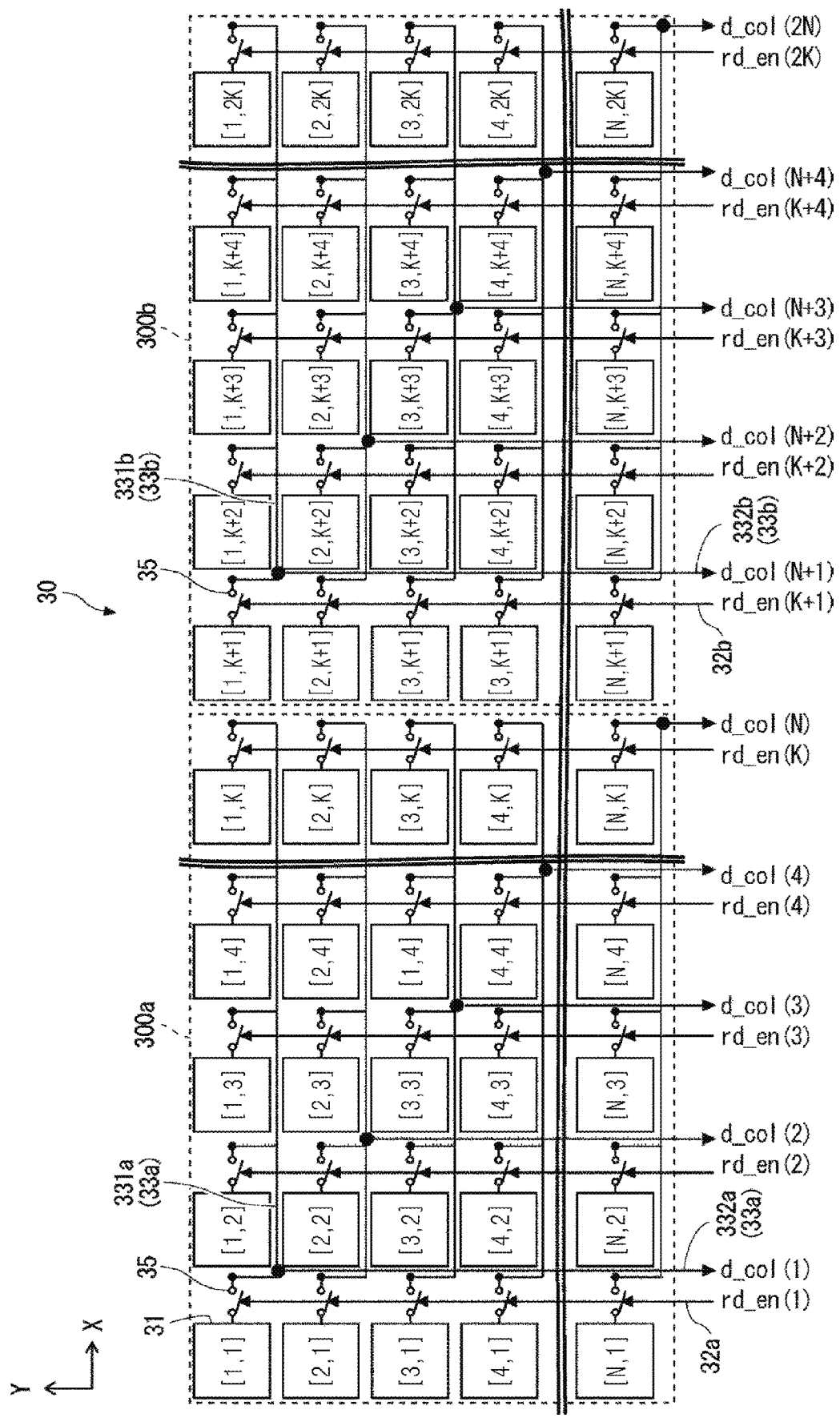
FIG. 2 is a configuration diagram of a memory circuit in a semiconductor device according to the first embodiment.

Below, the memory part 30 will be more fully described with reference to FIG. 2. FIG. 2 is a configuration diagram of a memory circuit in a semiconductor device according to the first embodiment. The memory part 30 includes a memory circuit 300a and a memory circuit 300b. A two-dimensional orthogonal coordinate system illustrated in FIG. 2 indicates the same directions as FIG. 1.

Below, a configuration of the memory circuit 300a will be described. The memory circuit 300a includes a plurality of memories 31 arranged in the form of a matrix along the X-axis and the Y-axis, a plurality of word lines 32a, and a plurality of bit lines 33a.

The memory circuit 300a includes the plurality of memories 31. The memories 31 are disposed in a K×N matrix: "K" in the X-axis direction and "N" in the Y-axis direction. Coordinates of the Y-axis direction and coordinates of the X-axis direction are illustrated in FIG. 2. In detail, coordinates of the memory 31 on the left top are [1, 1]. A right value of the coordinates is a coordinate of the X-axis direction and sequentially increases up to "K" in the positive direction of the X-axis. Also, a left value of the coordinates is a coordinate of the Y-axis direction and sequentially increases up to "N" in a negative direction of the Y-axis. That is, in the memory circuit 300a, the coordinates of the memory 31 on the right bottom are [N, K].

The memory circuit 300a includes the "N" memories 31 arranged in the Y-axis direction. The "N" memories 31 arranged in the Y-axis direction constitute a signal of a one-word quantity (an N-bit signal) obtained through the AD conversion of the ADC circuit 20. For example, the coordinates of [1, 1] are an LSB, and the coordinates of [N, 1] are an MSB. Alternatively, the coordinates of [1, 1] are an MSB, and the coordinates of [N, 1] are an LSB.

In the following description, the above-described memory array is expressed by using rows and columns. In detail, memories arranged on a straight line in a direction parallel to the X-axis are expressed as one row, and memories arranged on a straight line in a direction parallel to the Y-axis are expressed as one column. For example, the same row as the memory 31 having the coordinates of [1, 1] includes memories having the coordinates of [1, 2], [1, 3] . . . [1, 2K]. Memories having the coordinates of [2, 1], [3, 1] . . . [N, 1] are disposed at the same column as the memory 31 having the coordinates of [1, 1]. That is, in the memory part 30, memories corresponding to a one-word quantity constitute one column, and one row includes memories disposed at the same digits of signals. In the case of expressing a column of memories, the terms "first" to "2K-th" are used from the coordinates of [1, 1] on the left top. Likewise, in the case of expressing a row of memories, the terms "first" to "N-th" are used from the coordinates of [1, 1] on the left top.

The word line 32a may be used to read a signal of a one-word quantity in the Y-axis direction. The word line 32a is adjacent to the memories 31 of a one-word quantity arranged in the Y-axis direction and extends along a column of the memories 31. A switch 35 for reading the memories 31 of a one-word quantity is provided. The switch 35 may include, for example, a metal oxide semiconductor field effect transistor (MOSFET). When the word line 32a is supplied with a read signal (called a "read enable signal") from the memory controller (not illustrated), the switch 35 changes from an off state to an on state. It is possible to read signals of the memories 31 corresponding to the on state. The word lines 32a are supplied with the corresponding one of read signals rd_en(1) to rd_en(K) from the memory controller so as to read the memories 31 of the corresponding column.

In the following description, a first word line of the plurality of word lines 32a is expressed as a word line 32a(1), a second word line is expressed as a word line 32a(2), and a K-th word line is expressed as a word line 32a(K).

The bit line 33a transmits a signal of the memory 31 to the signal output circuit 40. The bit line 33a includes a digit line 331a and an output line 332a. The digit line 331a extends in the X-axis direction and is connected to the plurality of memories 31 arranged in the X-axis direction. For example, in the memory circuit 300a, the digit line 331a disposed on the uppermost side of the drawing is connected to the memories 31 having the coordinates of [1, 1], [1, 2] . . . [1, K], each of which stores an LSB. Another digit line 331a adjacent in the negative direction of the Y-axis is connected to the memories 31 having the coordinates of [2, 1], [2, 2] . . . [2, K], each of which stores a signal of a digit next to the LSB. In other words, the digit line 331a is connected to the memories 31 disposed at the same row in the memory circuit 300a.

The output line 332a is connected to the digit line 331a, extends in the Y-axis direction, and transmits a signal output from the memory 31 connected thereto to the signal output circuit 40. The output line 332a is disposed adjacent to the memories 31 arranged in the Y-axis direction. One output line 332a is connected to one digit-line 331a. Accordingly, signals stored in the plurality of memories connected to the digit line 331a are transmitted through the common output line 332a. That is, signals (or bits) corresponding to the same digit from among a plurality of binary signals are transmitted through one common output line 332a.

The output line 332a outputs a signal stored in the memory 31 of the corresponding row. In detail, an output line 332a(1) outputs a signal d_col(1). An output line 332a(2) outputs a signal d_col(2), and an output line 332a(N) outputs a signal d_col(N).

In the following description, a first bit line of the plurality of bit lines 33a is expressed as a bit line 33a(1), a second bit line is expressed as a bit line 33a(2), and an N-th bit line is expressed as a bit line 33a(N). Likewise, with regard to the digit line 331a and the output line 332a, a number corresponding to each row is written in a parenthesis to indicate a digit at which a digit line/output line is disposed.

As described above, one word-line 32a is adjacent to a column of the memories 31 of a one-word quantity arranged in the Y-axis direction, and one output line 332a is adjacent to the word line 32a and the column of the memories 31.

The memory circuit 300a is described above, but a configuration of the memory circuit 300b adjacent thereto is the same as the configuration of the memory circuit 300a. For this reason, the detailed description is omitted, but a main configuration of the memory circuit 300b will be described. The memory circuit 300b includes the memories 31, word lines 32b, bit lines 33b, and the switches 35. The coordinates of the memory 31 on the left top of the memory circuit 300b are [1, K+1], and the coordinates of the memory 31 on the right bottom of the memory circuit 300b is [N, 2K]. Also, the memory circuit 300b includes "K" word lines 32b(1) to 32b(K) and "N" bit lines 33b(1) to 33b(N). The bit line 33b includes a digit line 331b and an output line 332b.

In the memory circuit 300b, the word line 32b is supplied with the corresponding one of read signals rd_en(K+1) to rd_en(2K) from the memory controller so as to read the memories 31 of the corresponding column. Also, the output line 332b outputs a signal stored in the memory 31 of the corresponding row. In detail, an output line 332b(1) outputs an output signal d_col(N+1). An output line 332b(2) outputs a signal d_col(N+2), and an output line 332b(N) outputs a signal d_col(2N).

Figure 3:
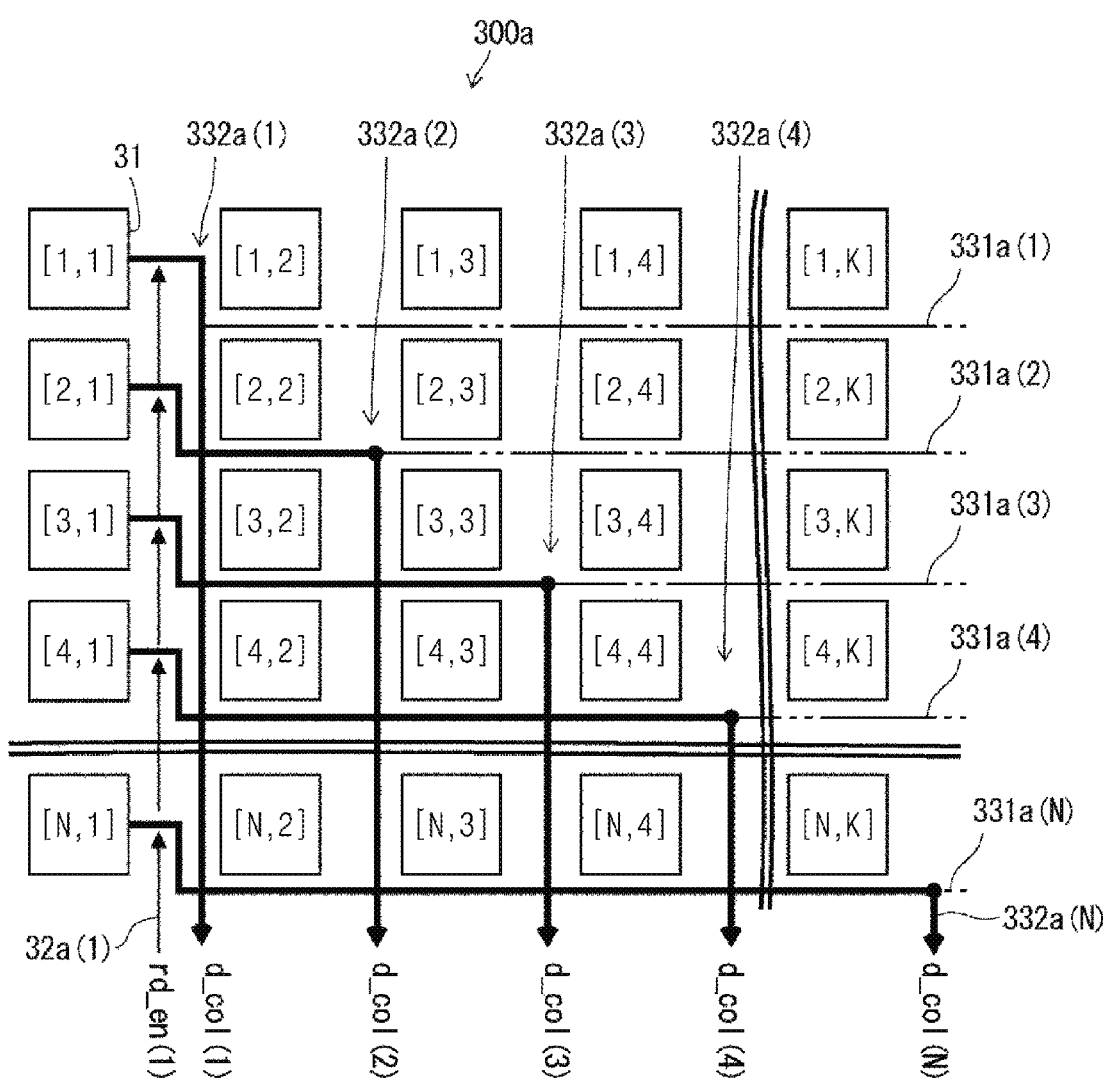
FIG. 3 is a diagram illustrating a signal flow of a memory circuit.

Below, a signal flow of a memory circuit will be described with reference to FIG. 3. FIG. 3 is a diagram illustrating a signal flow of a memory circuit. FIG. 3 schematically illustrates the memory circuit 300a of the memory part 30. The word line 32a(1) is a word line corresponding to a first memory arrangement. The digit line 331a(1) is a digit line corresponding to the first memory arrangement. In addition, the output line 332a(1) is an output line connected to the digit line 331a(1). Likewise, the digit line 331a(N) is a digit line corresponding to an N-th memory arrangement. Likewise, the output line 332a(N) is an output line connected to the digit line 331a(N). An arrow of a bold line illustrated in FIG. 3 means a flow of a signal output from the memory 31. The example illustrated in FIG. 3 corresponds to the case where the word line 32a(1) is supplied with the read signal rd_en(1) from the memory controller.

When the word line 32a(1) is supplied with the read signal rd_en(1) for reading the first memory 31 from the memory controller, the corresponding switch 35 changes to an on state. As such, the first memory 31 is connected to the corresponding bit line 33a. In this case, a signal stored in the first memory 31 is transmitted to the output line 332a through the digit line 331a of the corresponding bit line 33a, and the transmitted signal is provided to the signal output circuit 40.

For example, the memory 31 having the coordinates of [1, 1] provides a signal to the digit line 331a(1). The output line 332a(1) connected to the digit line 331a(1) outputs the signal (i.e., the output signal d_col(1)) of the memory 31 having the coordinates of [1, 1].

Also, the memory 31 having the coordinates of [2, 1] provides a signal to the digit line 331a(2). The output line 332a(2) connected to the digit line 331a(2) outputs the signal (i.e., the output signal d_col(2)) of the memory 31 having the coordinates of [2, 1].

As in the above description, the memory 31 having the coordinates of [N, 1] provides a signal to the digit line 331a(N). The output line 332a(N) connected to the digit line 331a(N) outputs the signal (i.e., the output signal d_col(N)) of the memory 31 having the coordinates of [N, 1].

The memory controller supplies one read signal to one memory circuit at a certain time. For example, when one word line 32a of the memory circuit 300a is supplied with the read signal rd_en(1), read signals are not provided to the remaining word lines 32a of the memory circuit 300a. As such, the digit line 331a connected to the plurality of memories 31 receives a signal from one memory 31 connected to a read signal. That is, the memory circuit 300a may output a binary signal of a one-word quantity from the plurality of bit lines 33a by selecting the memories 31 belonging to one column such that a read operation is able to be performed on the word line 32a.

Figure 4:
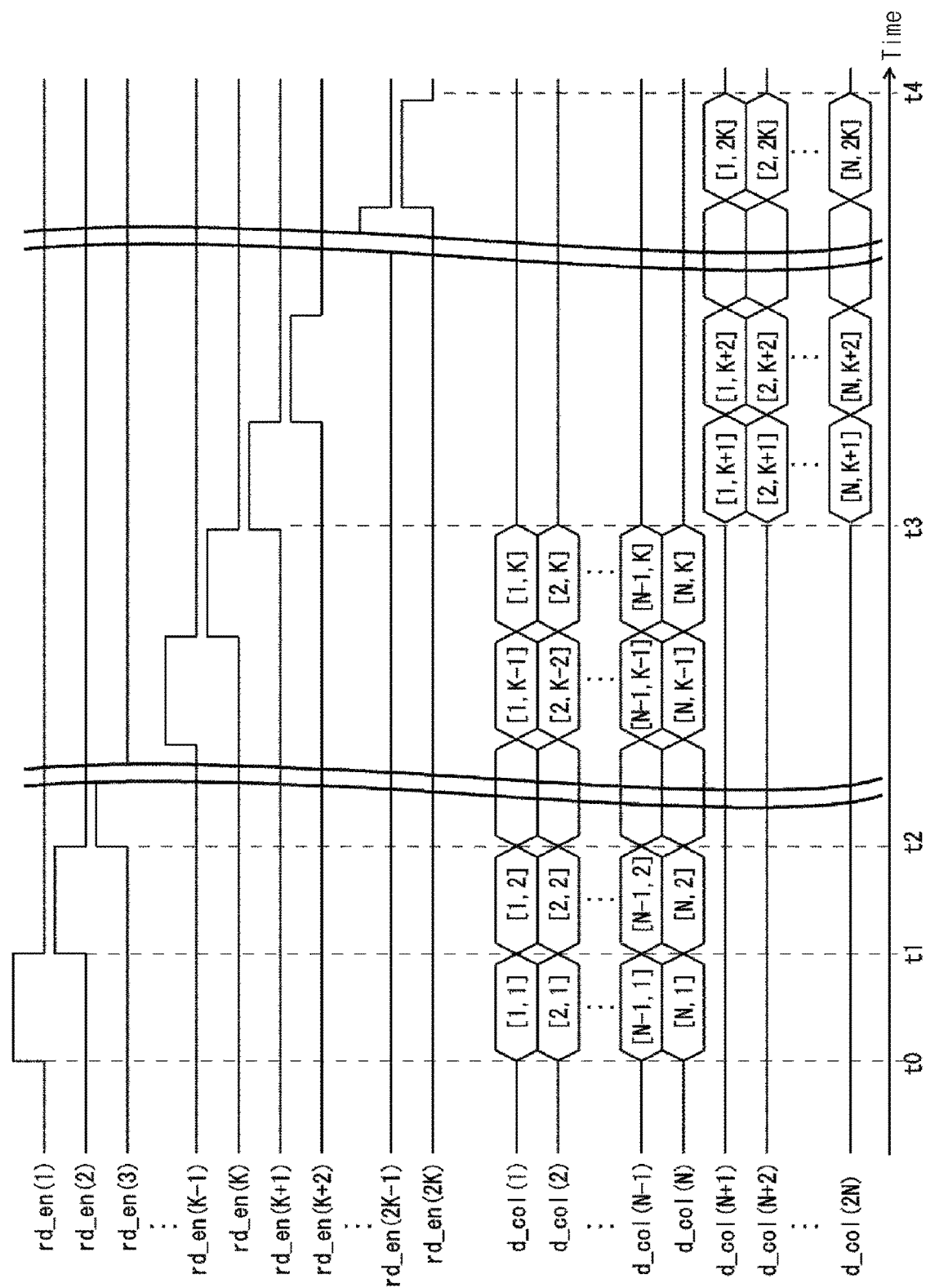
FIG. 4 is a timing diagram illustrating an example of signals that a memory circuit outputs.

Below, a relationship between read signals and output signals will be more fully described with reference to FIG. 4. FIG. 4 is a timing diagram illustrating an example of signals that a memory circuit outputs. In FIG. 4, an upper portion indicates read signals that the word lines 32a and the word lines 32b receive from the memory controller. For example, the read signal rd_en(1) that the word line 32a(1) receives is illustrated on the uppermost side of FIG. 4 and the remaining read signals rd_en(2) to rd_en(2K) are sequentially illustrated below the read signal rd_en(1).

The word line 32a(1) is supplied with the read signal rd_en(1) from a time t0 to a time t1. As such, a read signal is continuously provided to a word line during a given read period. The given read period is a period from a time when a read signal is transmitted to a word line to a time when a signal of the memory 31 is output.

The read signal rd_en(2) downwards adjacent to the read signal rd_en(1) is a read signal with which the word line 32a(2) is supplied. As illustrated in FIG. 4, a read signal is supplied for each column so as not to overlap each other. When the supplying of a read signal to a word line is terminated, a read signal is provided to a word line of a next column. Accordingly, word lines are respectively supplied with read signals sequentially of the same period, and finally, the word line 32b(2K) is supplied with the read signal rd_en(2K).

Output signals of the bit lines 33a and the bit lines 33b are illustrated below the read signals. An output signal d_col(1) corresponds to the bit line 33a(1) of the memory circuit 300a. An output signal d_col(2) downwards adjacent to the output signal d_col(1) corresponds to the bit line 33a(2) of the memory circuit 300a. An output signal d_col(N) corresponds to the bit line 33a(N) of the memory circuit 300a. As in the above description, an output signal d_col(N+1) corresponds to the bit line 33*b*(1) of the memory circuit 300*b*, and an output signal d_col(2N) corresponds to the bit line 33*b*(N) of the memory circuit 300*b*.

As illustrated in FIG. 4, an output signal of the bit line 33*a* corresponds to the word line 32*a*, and an output signal of the bit line 33*b* corresponds to the word line 32*b*. For example, from the time t0 to the time t1, signals corresponding to the word line 32*a*(1) are output through the bit lines 33*a*(1) to 33*a*(N). In this case, a signal stored in the memory 31 having the coordinates of [1, 1] is output to the output line 332*a*(1) as the output signal d_col(1) of the bit line 33*a*(1). As in the above description, a signal stored in the memory 31 having the coordinates of [2, 1] is output as the output signal d_col(2) of bit line 33*a*(2), and a signal stored in the memory 31 having the coordinates of [N, 1] is output to the output line 332*a*(N) as the output signal d_col(N) of bit line 33*a*(N).

Then, from the time t1 to a time t2, signals corresponding to the word line 32*a*(2) are output through the bit lines 33*a*(1) to 33*a*(N). In this case, a signal stored in the memory 31 having the coordinates of [1, 2] is output to the output line 332*a*(1) as the output signal d_col(1) of the bit line 33*a*(1). As in the above description, a signal stored in the memory 31 having the coordinates of [2, 2] is output as the output signal d_col(2) of the bit line 33*a*(2), and a signal stored in the memory 31 having the coordinates of [N, 2] is output as the output signal d_col(N) of the bit line 33*a*(N).

As such, the memory circuit 300*a* sequentially outputs a signal of a one-word quantity stored for each column through the bit lines 33*a* shared at respective digits while changing the word lines 32*a* sequentially until a time t3.

Next, from the time t3 to a time t4, the memory circuit 300*b* outputs signals through the bit lines 33*b* like the memory circuit 300*a* described above. That is, from the time t3 to the time t4, the memory circuit 300*b* are sequentially supplied with the read signal rd_en(K+1) to the read signal rd_en(2K) while changing the word lines 32*b*(K+1) to the word line 32*b*(2K) sequentially. The bit lines 33*b* sequentially output a signal of a one-word quantity corresponding to a read signal as the output signals d_col(N+1) to d_col (2N).

As described above, the semiconductor device 1 according to the first embodiment outputs a signal of a one-word quantity stored in the memory part 30 sequentially. For this reason, the semiconductor device 1 does not need to arrange binary signals that the memory part 30 outputs sequentially. According to the above configuration, the semiconductor device 1 may suppress an increase in the size of a signal output circuit and may output a desired signal.

Figure 5:
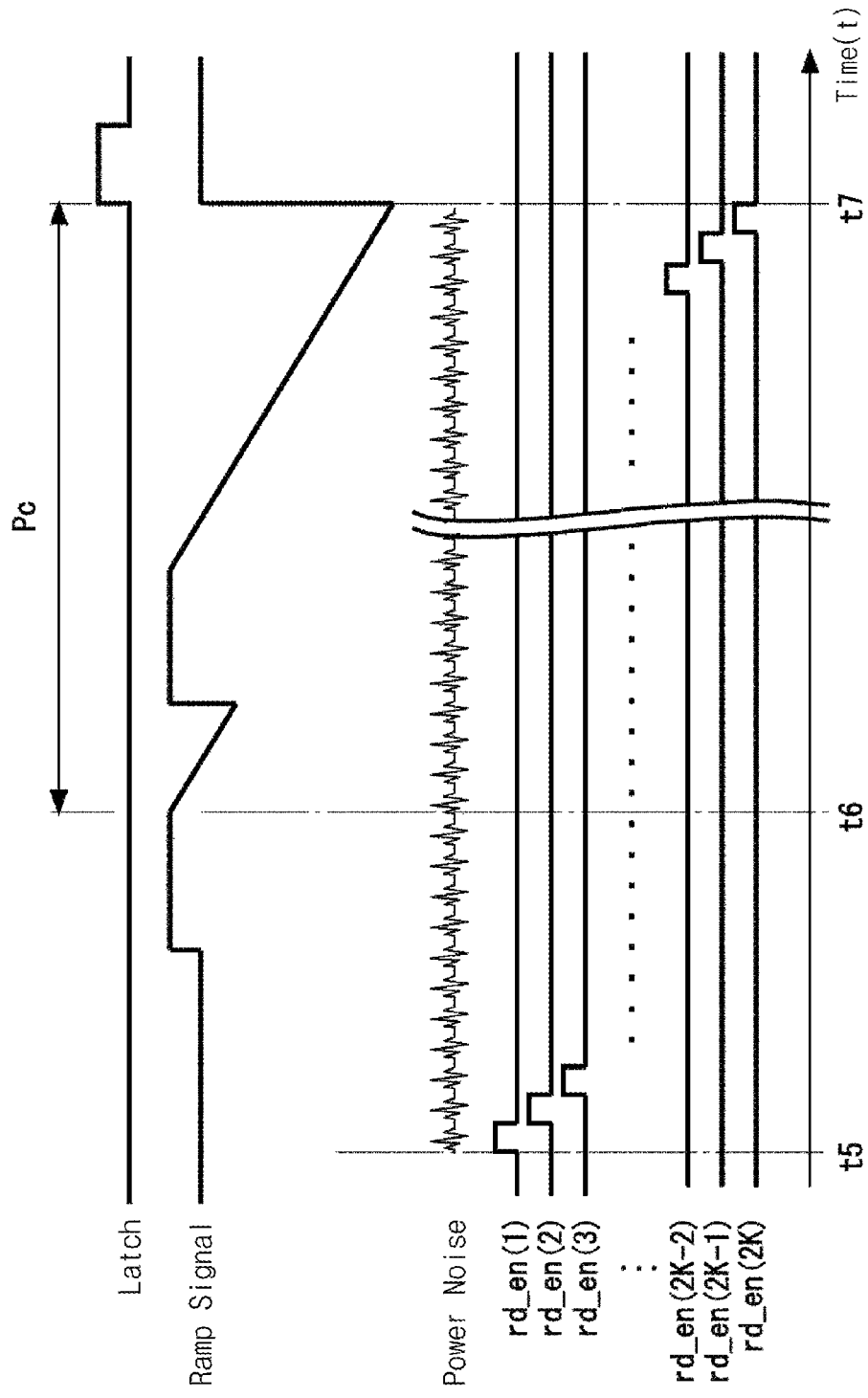
FIG. 5 is a timing diagram of signals that an analog-to-digital converter (ADC) circuit and a memory circuit output.

Below, a signal processing relationship between the ADC circuit 20 and the memory part 30 will be described with reference to FIG. 5. FIG. 5 is a timing diagram of signals that an ADC circuit and a memory circuit output. In FIG. 5, a transmission control signal latch and a ramp signal on the uppermost side are waveforms for controlling the ADC circuit 20 and the memory part 30, respectively. A binary signal after AD conversion is transmitted to the memory part 30 in response to the transmission control signal latch. A power noise below the ramp signal is a waveform of noise occurring in a power circuit of the ADC circuit 20. A plurality of square waves below the power noise are read signals generated in the memory controller and the memory part 30.

In FIG. 5, during a period from a time t5 to a time t7, the memory controller generates read signals so as to be sequentially supplied to the memory part 30. As such, the memory part 30 outputs output signals corresponding to a read signal for each word line so as to be supplied to the signal output circuit 40. The signal output circuit 40 sequentially outputs the output signals to a different circuit which are received from the memory part 30.

The above operations performed by the memory controller, the memory part 30, and the signal output circuit 40 during the period from the time t5 to the time t7 cause the power noise in the power circuit of the ADC circuit 20 as illustrated in FIG. 5. This power noise occurs due to a variation in a power supply voltage that has an influence on the above operations. That is, as a variation in a voltage accompanied by one read signal increases, the power noise may increase. In other words, the amplitude of the power noise may be suppressed by suppressing a variation in a voltage accompanied by one read signal.

Meanwhile, during a period Pc from a time t6 to the time t7, the ADC circuit 20 generates the ramp signal to perform AD conversion. That is, during the period Pc, the semiconductor device 1 simultaneously performs an AD conversion operation of the ADC circuit 20 and an operation of reading signals stored in the memory part 30.

In the case where a voltage of the ramp signal varies, the ADC circuit 20 may fail to perform the AD conversion correctly. For this reason, in the case where the ADC circuit 20 operates abnormally and the power noise is relatively great, it is not desirable to perform the above operations of the ADC circuit 20 and the memory circuit 300*b* at the same time (or in parallel). However, in the case where the ADC circuit 20 operates abnormally but the power noise is relatively small, a processing time may decrease by performing the above operations of the ADC circuit 20 and the memory circuit 300*b* in parallel.

For example, compared with the power noise in the first embodiment, a power noise is significantly great when signals are simultaneously read from a plurality of memories of the same digits, which are disposed in the X-axis direction of the memory array. As such, in the case where the power noise is significantly great, it is not desirable to perform the AD conversion operation of the ADC circuit 20 and the operation of reading signals from the memory part 30 in parallel. In contrast, in the semiconductor device 1 according to the first embodiment, a very small signal of about 10 bits is read in response to one read signal. Accordingly, the semiconductor device 1 may suppress a power noise accompanied by a signal read operation of the memory part 30 to be small.

Figure 6:
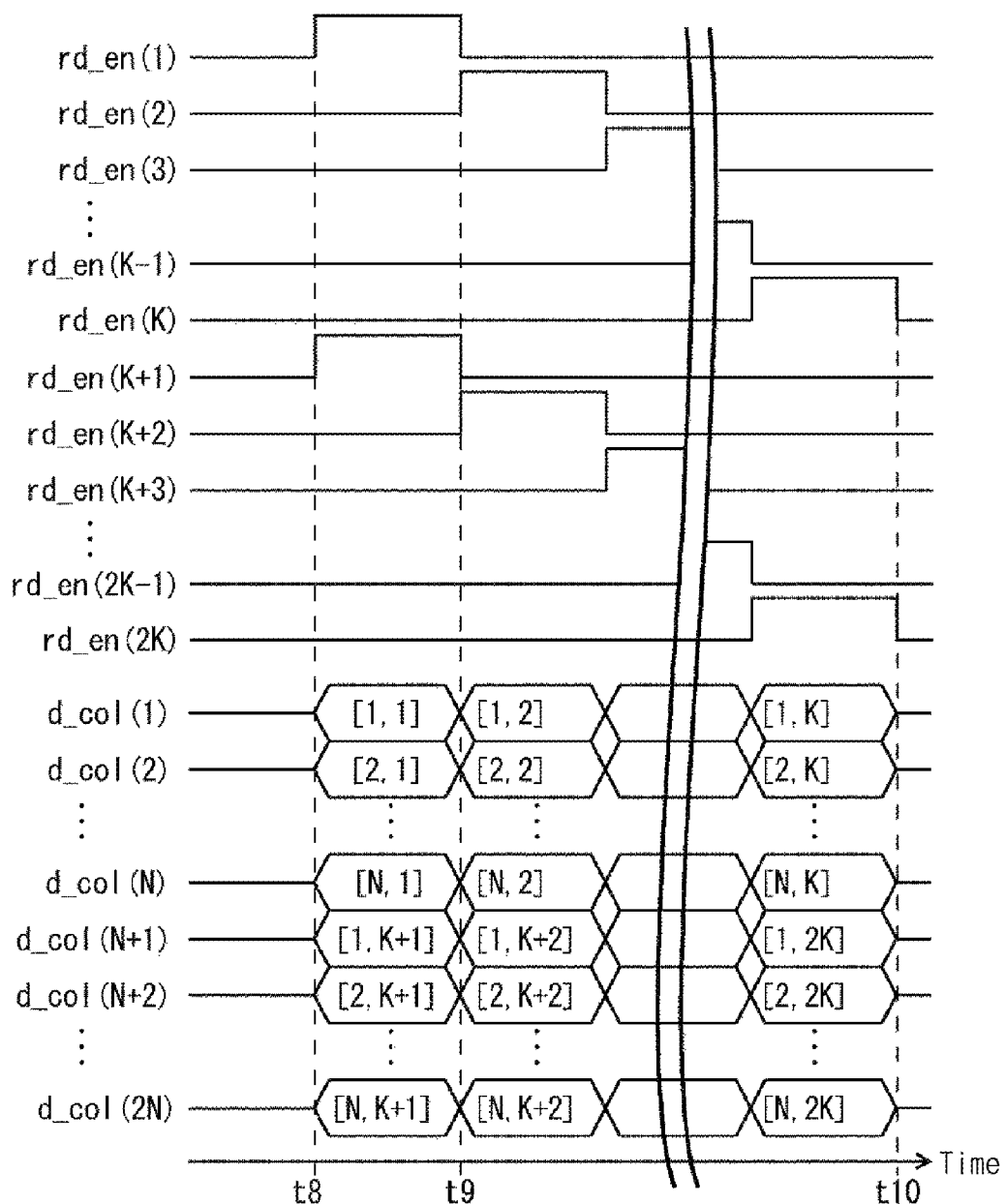
FIG. 6 is a timing diagram illustrating another example of signals that a memory circuit outputs.

Below, a variation occurring upon reading a signal from the memory 31 will be described with reference to FIG. 6. FIG. 6 is a timing diagram illustrating another example of signals that a memory circuit outputs. Unlike the example illustrated in FIG. 4, an example where the memory circuit 300*a* and the memory circuit 300*b* of the semiconductor device 1 perform signal read operations in parallel is illustrated in FIG. 6.

That is, during a period from a time t8 to a time t9, the word line 32*a*(1) of the memory circuit 300*a* is supplied with the read signal rd_en(1). As such, a binary signal is output from memories having the coordinates [1, 1] to [N, 1] to the bit lines 33*a*(1) to 33*a*(N).

During the period from the time t8 to the time t9, also, the word line 32*a*(K+1) of the memory circuit 300*b* is supplied with the read signal rd_en(K+1). As such, a binary signal is output from memories having the coordinates [1, K+1] to [N, K+1] to the bit lines 33*b*(1) to 33*b*(N).

Accordingly, during the period from the time t8 to the time t9, a binary signal corresponding to the word line 32a(1) of the memory circuit 300a and a binary signal corresponding to the word line 32b(K+1) of the memory circuit 300b are simultaneously output.

As such, the semiconductor device 1 may read signals from all the memories 31 during a period from the time t8 to a time t10 by simultaneously supplying read signals to word lines of different memory circuits. In this case, a time taken to perform a read operation is substantially halved compared to the example illustrated in FIG. 4.

Binary signals of two word-quantities may be read by supplying read signals to two word-lines at the same time. An embodiment where the semiconductor device 1 includes two memory circuits (i.e., the memory circuit 300a and the memory circuit 300b) is described above, but the disclosure is not limited thereto. For example, the semiconductor device 1 may include three or more memory circuits. In this case, binary signals of three or more word-quantities may be simultaneously read by supplying read signals to three or more word-lines at the same time. As such, a time take to perform signals from memory circuits is shortened to 1/N (N being three or more).

In the case of supplying read signals to a plurality of word lines, a power noise of the ADC circuit 20 does not reach a level that is able to cause an abnormal operation of the ADC circuit 20. Accordingly, as described with reference to FIG. 5, the AD conversion of the ADC circuit 20 and the operation of reading signals from the memory part 30 may be performed in parallel. According to the above configuration, the semiconductor device 1 may shorten a processing time.

The first embodiment is described above, but the semiconductor device 1 according to the first embodiment is not limited to the configuration described above. For example, the memory part 30 may include three or more memory circuits. In one memory circuit 300, the number of word lines 32 and the number of bit lines 33 do not need to be the same. That is, in the above description, "N" and "K" do not need to be the same. Also, the numbers of word lines 32 that the plurality of memory circuits 300 include do not need to be the same. The numbers of bit lines 33 that the plurality of memory circuits 300 include do not need to be the same. For example, in the memory circuit 300, in the case where the number of word lines 32 is more than the number of bit lines 33, a portion where an output line is not disposed adjacent to the word line 32 may exist.

Also, in the above description, the memory circuit 300a is configured such that word lines are not disposed adjacent to each other and is configured such that a bit lines are not disposed adjacent to each other. As such, the semiconductor device 1 may suppress an increase in the circuit area, and thus, a circuit of good efficiency may be implemented. However, even though the disclosure does not correspond to the configuration, it is desirable to read a binary signal of one word-quantity corresponding to a selected word line one by one. In this case, the semiconductor device 1 may include a portion where a word lines are disposed adjacent to each other and may include a portion where a bit lines are disposed adjacent to each other.

As described above, according to the first embodiment, a semiconductor device that suppresses an increase in the area of a signal output circuit may be provided.

Second Embodiment

Below, a second embodiment will be described. The second embodiment is different from the first embodiment in terms of a configuration of a circuit that transmits a signal output from a memory circuit. Accordingly, a description will be focused on a difference between the first embodiment and the second embodiment.

Figure 7:
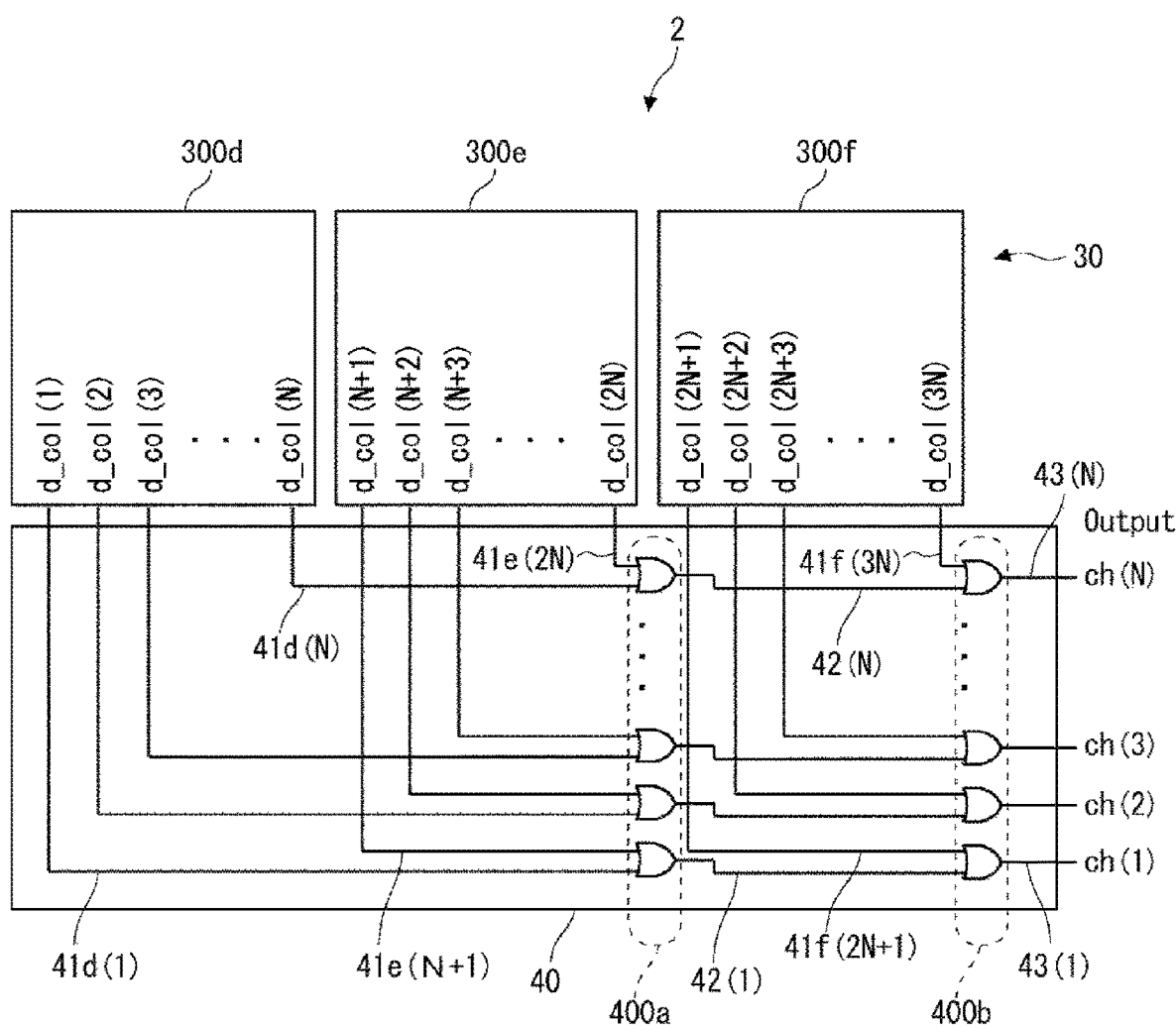
FIG. 7 is a diagram illustrating a signal output circuit of a semiconductor device according to a second embodiment.

FIG. 7 is a diagram illustrating a signal output circuit of a semiconductor device according to a second embodiment. A semiconductor device 2 includes the memory part 30 including three memory circuits 300d, 300e, and 300f. The memory circuit 300d includes "N" output lines, through which output signals d_col(1) to d_col(N) are output. The memory circuit 300e also includes "N" output lines, through which output signals d_col(N+1) to d_col(2N) are output. Likewise, the memory circuit 300f includes "N" output lines, through which output signals d_col(2N+1) to d_col (3N) are output.

The signal output circuit 40 is supplied with output signals from the memory part 30. The signal output circuit 40 includes a plurality of transmission lines 41 respectively corresponding to output signals. The following signs are added to the plurality of transmission lines 41 depending on the corresponding output signals. For example, a transmission line connected to the output signal d_col(1) of the memory circuit 300d is called a "transmission line 41d(1)". A transmission line connected to the output signal d_col(N) of the memory circuit 300d is called a "transmission line 41d(N)". A transmission line connected to the output signal d_col(N+1) of the memory circuit 300e is called a "transmission line 41e(N+1)", and a transmission line connected to the output signal d_col(2N) of the memory circuit 300e is called a "transmission line 41e(2N)". A transmission line connected to the output signal d_col(2N+1) of the memory circuit 300f is called a "transmission line 41f(2N+1)", and a transmission line connected to the output signal d_col(3N) of the memory circuit 300f is called a "transmission line 41f(3N)".

The signal output circuit 40 may include "N" logic circuits 400a and "N" logic circuits 400b. Each of the logic circuits 400a and 400b may have a function of receiving two signals, performing a logical operation on the received signals, and outputting a result of the logical operation. In the second embodiment, each of the logic circuits 400a and 400b may be configured to perform an OR operation.

The logic circuit 400a receives one signal transmitted from the memory circuit 300d and one signal transmitted from the memory circuit 300e, performs a logical operation on the signals, and outputs a result of the logical operation to the transmission line 42. One logic circuit 400a is configured to receive, from the memory circuits 300d and 300e, signals of a digit corresponding to one logic circuit 400a. For example, in the case where one logic circuit 400a receives a first digit signal (i.e., the output signal d_col(1)) of a binary signal from the memory circuit 300d, the logic circuit 400a also receives a first digit signal (i.e., the output signal d_col(N+1)) from the memory circuit 300e. As in the above description, in the case where one logic circuit 400a receives an N-th digit signal (i.e., the output signal d_col(N)) of the binary signal from the memory circuit 300d, the logic circuit 400a also receives an N-th digit signal (i.e., the output signal d_col(2N)) from the memory circuit 300e. Each of the N logic circuits 400a receives bits corresponding to the same digit from among bits of binary signals and outputs a result of performing the OR operation to the transmission line 42.

A number corresponding to a digit of a binary signal is added to the transmission line 42 with a parenthesis. That is, the logic circuit 400a that outputs a result of performing the OR operation on bits of binary signals corresponding to the first digit is connected to the transmission line 42(1), and the logic circuit 400a that outputs a result of performing the OR operation on bits of the N-th digit of the binary signals is connected to the transmission line 42(N).

The logic circuit 400a receives either a signal "H" (High) of a relatively high voltage level or a signal "L" (Low) of a relatively low voltage level from each of the memory circuit 300d and the memory circuit 300e. In the second embodiment, all signals of circuits not associated with a read signal are set to a voltage level of the signal "L". That is, when one of two signals transmitted to the logic circuit 400a corresponds to the signal "H", each of the logic circuits 400a and 400b outputs the signal "H". The transmission lines 42(1) to 42(N) are connected to the corresponding logic circuits 400b, respectively.

The logic circuit 400b receives a result signal of a logical operation transmitted through the transmission line 42 and one signal transmitted from the memory circuit 300f, performs a logical operation on the signals, and outputs a result of the logical operation to the transmission line 43. A number of corresponding to a corresponding digit of a binary signal is added to the transmission line 43 with a parenthesis. That is, the logic circuit 400b that outputs a result of performing the OR operation on bits of binary signals corresponding to the first digit is connected to the transmission line 43(1), and the logic circuit 400b that outputs a result of performing the OR operation on bits of the binary signals corresponding to the N-th digit is connected to the transmission line 43(N). A signal output from the transmission line 43(N) is a signal ch(N). In this case, the signal ch(N) is an N-th digit signal of a binary signal of a column to which a read signal is supplied.

The logic circuit 400b is configured to receive corresponding digit signals of binary signals from the logic circuit 400a and the memory circuit 300f, similarly to the logic circuit 400a. For example, when one logic circuit 400b receives an operation result corresponding to an N-th digit signal of a binary signal through the transmission line 42(N), the logic circuit 400b also receives an N-th digit signal (i.e., the output signal d_col(3N)) from the memory circuit 300f. In this case, the logic circuit 400b outputs the signal ch(N) to the transmission line 43(N) as an N-th digit signal.

As described above, the logic circuit 400a and the logic circuit 400b are connected in the form of a cascade to output results of logical operations associated with corresponding digit signals. For example, when the logic circuit 400a receives the signal "H" from one of the memory circuit 300d and the memory circuit 300e, the logic circuit 400a outputs the signal "H" as an operation result. That is, a signal that the logic circuit 400b receives from the logic circuit 400a corresponds to a signal output from the memory circuit 300d or the memory circuit 300e. That is, two signals that the logic circuit 400b connected in the form of a cascade receives are the corresponding digit signals of binary signals that all memory circuits store.

The above configuration may be described as follows. The logic circuit 400a receives a first signal transmitted from a bit line of the memory circuit 300d and a second signal transmitted from a bit line of the memory circuit 300e and outputs a result of performing a logical operation on the first and second signals as a result of a first logical operation.

The logic circuit 400b may be described as follows. The logic circuit 400b receives a first signal being the result of the first logical operation and a second signal transmitted from a bit line of the memory circuit 300f and outputs a result of performing a logical operation on the first and second signals. In this case, the first signal is a signal corresponding to one of a signal transmitted from a bit line of the memory circuit 300d and a signal transmitted from a bit line of the memory circuit 300e.

Below, a signal flow will be described together with a detailed example with reference to accompanying drawings. It is assumed that any word line of the memory circuit 300d is supplied with a read signal. That is, each of the output signals d_col(1) to d_col(N) of the memory circuit 300d that is a binary signal received from the ADC circuit 20 outputs either the signal "H" or the signal "L". Accordingly, the logic circuit 400a is supplied with the above-described signal from the memory circuit 300d. Meanwhile, in this case, a read signal is not supplied to the memory circuit 300e. Accordingly, each of all output signals of the memory circuit 300e is the signal "L". This means that the logic circuit 400a is supplied with the signal "L" from the memory circuit 300e. The logic circuit 400a performs a logical operation on the signals thus received. As a result, the logic circuit 400a outputs the same signal as a signal received from the memory circuit 300d to the logic circuit 400b.

Then, the logic circuit 400b receiving the operation result from the logic circuit 400a is supplied with an output signal from the memory circuit 300f. Because a read signal is not supplied to the memory circuit 300f, each of all output signals of the memory circuit 300f is the signal "L". Accordingly, the logic circuit 400b performs a logical operation on the signals thus received, and thus outputs the same signal as the signal received from the memory circuit 300d to the transmission line 43.

An increase in the circuit area of the signal output circuit 40 in the semiconductor device 2 may be suppressed by connecting corresponding digit signals of binary signals in the form of a cascade through logic circuits. In the above example, the semiconductor device 2 includes the memory circuit 300d, the memory circuit 300e, and the memory circuit 300f, but the disclosure is not limited thereto. For example, the semiconductor device 2 may include four or more memory circuits. In this case, even though the number of memory circuits increases, because corresponding digit signals of binary signals are connected in the form of a cascade through logic circuits, signal lines may not be dense, and a circuit may be implemented to be simple.

Figure 8:
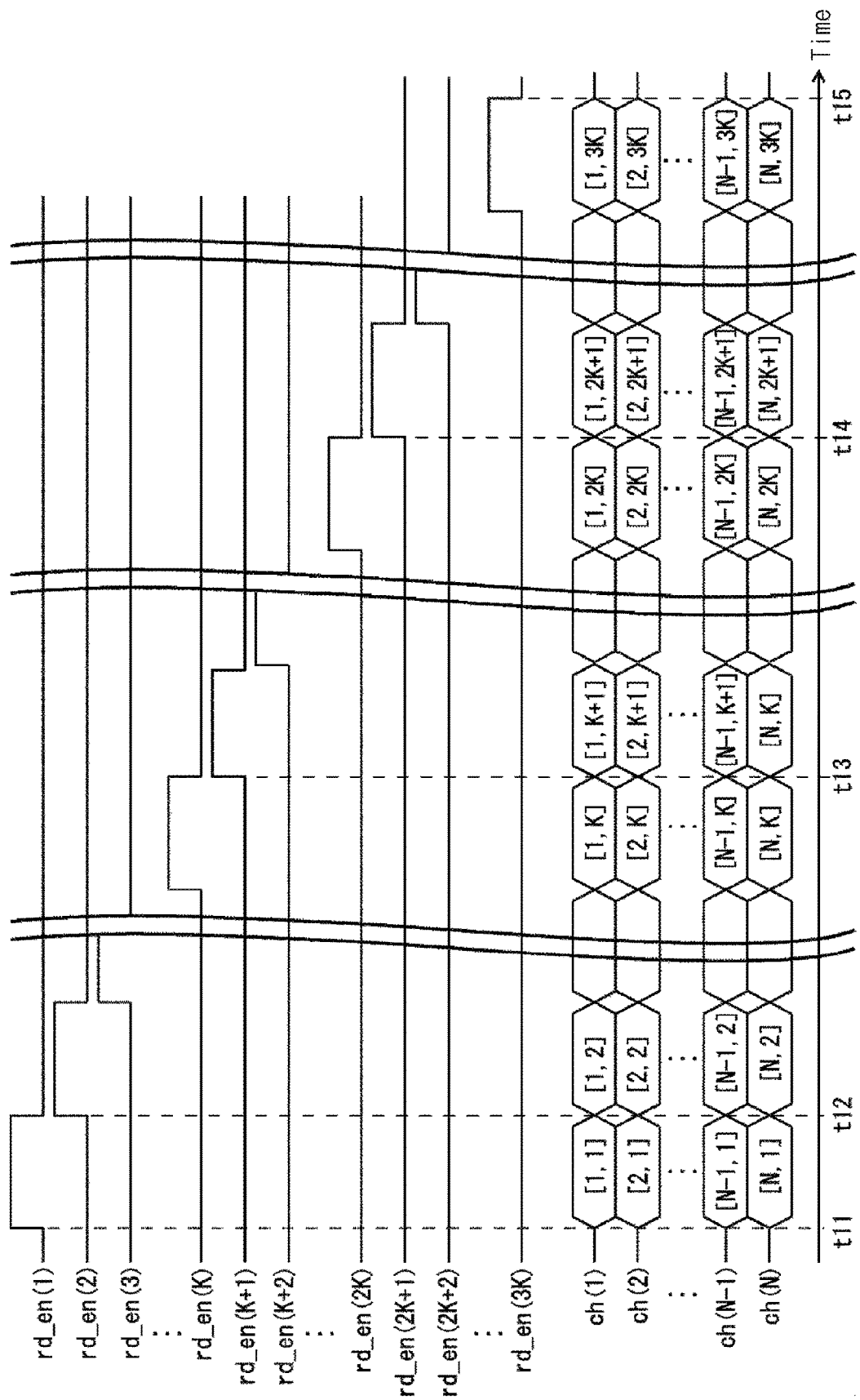
FIG. 8 is a timing diagram of signals that a semiconductor device according to the second embodiment outputs.

Below, a signal processing operation of the signal output circuit 40 will be more fully described with reference to FIG. 8. FIG. 8 is a timing diagram of signals that a semiconductor device according to the second embodiment outputs. The read signals rd_en(1) to rd_en(3K) that the memory circuits 300d to 300f receive are illustrated on the upper side of FIG. 8. The memory controller sequentially supplies the read signals rd_en(1) to rd_en(3K) from the first word line 32(1) to the 3K-th word line 32(3K).

Signals that the transmission lines 43(1) to 43(N) of the signal output circuit 40 output are illustrated on the lower side of FIG. 8. The transmission line 43(1) outputs the signal ch(1), the transmission line 43(2) outputs the signal ch(2), and the transmission line 43(N) outputs the signal ch(N).

During a period from a time t11 to a time t12, the transmission lines 43 output signals of memories having the coordinates of [1, 1], [2, 1] . . . [N−1, 1], and [N, 1] as a binary signal corresponding to a first word line. During a period from the time t11 to a time t13, the transmission lines 43 sequentially output binary signals corresponding to the first to K-th word lines of the memory circuit 300d.

Then, during a period from the time t13 to a time t14, the transmission lines 43 sequentially output binary signals corresponding to the (K+1)-th to 2K-th word lines of the memory circuit 300e.

During a period from the time t14 to a time t15, the transmission lines 43 sequentially output binary signals corresponding to the (2K+1)-th to 3K-th word lines of the memory circuit 300f.

As such, the semiconductor device 2 according to the second embodiment may output common digit signals of binary signals through common transmission lines 43(1) to 43(N).

The second embodiment is described above. The semiconductor device 2 according to the second embodiment may output signals of a memory circuit receiving a read signal to another circuit through logic circuits connected in the form of a cascade. This configuration may make it possible to suppress an increase in the circuit area of the semiconductor device 2. For example, a central portion of a circuit may be complicated in the case of selectively outputting a signal by using a multiplexer. However, according to the second embodiment, because a circuit is implemented in the form of a cascade, the wiring density of the circuit may be suppressed from being focused on, an increase in the circuit area may be suppressed, and an increase in power consumption may be suppressed.

Logic circuits connected in the form of a cascade may be implemented with an AND operator instead of an OR operator. In this case, each memory circuit may be configured to output an output signal set to the signal "H" when not receiving a read signal.

The configuration according to the second embodiment is provided in plurality such that an operation of reading signals from a memory circuit and an operation of outputting signals are performed in parallel through a plurality of transmission lines. As such, a semiconductor device that suppresses an increase in the area and shortens a time taken to output signals may be provided.

Figure 9:
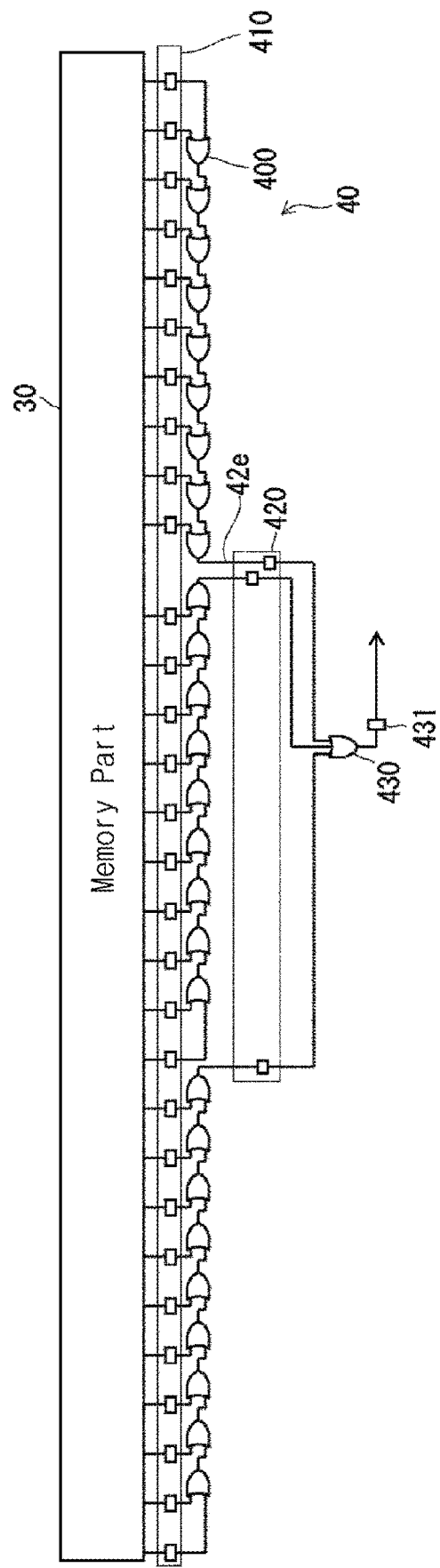
FIG. 9 is a configuration diagram of a memory circuit and a signal output circuit in a semiconductor device according to the second embodiment.

Below, another example of the second embodiment will be described with reference to FIG. 9. FIG. 9 is a configuration diagram of a memory circuit and a signal output circuit in a semiconductor device according to the second embodiment. Below, it is explained with reference to only a necessary portion of the memory part 30 and the signal output circuit 40 of the semiconductor device 2. A semiconductor device 3 includes 10 memory circuits. In the case of the semiconductor device 3, 9 logic circuits 400 are connected in the form of a cascade. The signal output circuit 40 of the semiconductor device 3 includes first to third flip-flop circuits 410, 420, and 431, and a signal control circuit 430.

The first flip-flop circuit 410 is interposed between a plurality of bit lines of the memory part 30 and the plurality of logic circuits 400 of the signal output circuit 40. The second flip-flop circuit 420 is connected to the transmission line 42e. The third flip-flop circuit 431 is connected to the signal control circuit 430. The flip-flop circuits 410, 420, and 431 arrange waveforms of digital signals such that a signal delay is suppressed. The signal control circuit 430 is connected to the plurality of transmission lines 42e and outputs a binary signal through the transmission lines 42e in a manner appropriately determined in advance.

According to the above configuration, the semiconductor device 3 may suppress degradation of a signal being transmitted and may suppress an increase in the circuit area.

According to the disclosure, a semiconductor device that suppresses an increase in the area of a signal output circuit may be provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A memory circuit comprising:
 a memory array including a plurality of memories arranged in a matrix shape in a first direction and a second direction perpendicular to the first direction, the matrix shape comprising a first row, a first column, and a second column;
 word lines for respectively reading signals from the plurality of memories arranged in the first direction and extending in the first direction;
 digit lines connected to the plurality of memories; and
 output lines connected to the digit lines and extending in the first direction wherein:
 a first word line, among the word lines, extends in the first direction between the first column and the second column and connects to memories, among the plurality of memories, within the first column, and
 a first output line, among the output lines, extends in the first direction between the first column and the second column, connects to memories, among the plurality of memories, within the first row, and outputs a value stored by each of the memories within the first row.

2. The memory circuit of claim 1, wherein the word lines extend in the first direction.

3. The memory circuit of claim 1, further comprising a plurality of switches, each of the plurality of switches connected to a respective memory, among the plurality of memories and configured to acquire data read from the respective memory.

4. The memory circuit of claim 1, wherein the output lines are respectively adjacent to the word lines and the plurality of memories arranged in the first direction.

5. The memory circuit of claim 1, wherein each of the digit lines is directly, electrically connected to a corresponding output line among the output lines.

6. A semiconductor device comprising a plurality of memory circuits, each of the plurality of memory circuits comprising:

a memory array including a plurality of memories arranged in a matrix shape in a first direction and a second direction perpendicular to the first direction, the matrix shape comprising a first row, a first column, and a second column;

word lines for respectively reading signals from the plurality of memories arranged in the first direction and extending in the first direction; and bit lines extending in the first direction, wherein:

a first word line, among the word lines, extends in the first direction between the first column and the second column and connects to memories, among the plurality of memories, within the first column, and a first bit line, among the bit lines, extends in the first direction between the first column and the second column, connects to memories, among the plurality of memories, within the first row, and outputs a value stored by each of the memories within the first row.

7. The semiconductor device of claim 6, wherein:

a first memory circuit, among the plurality of memory circuits, includes the first word line and the first bit line, a second memory circuit, among the plurality of memory circuits, includes a second word line of the word lines and a second bit line, among the bit lines, corresponding to the second word line and the semiconductor device further comprises a first logic circuit receiving a first signal based on an output from the first bit line and a second signal based on an output from the second bit line, performing a first logical operation based on the first signal and the second signal, and outputting a result of the first logical operation.

8. The semiconductor device of claim 7, wherein the first logic circuit performs an OR operation.

9. The semiconductor device of claim 7, wherein the first logic circuit performs an AND operation.

10. The semiconductor device of claim 7, further comprising a flip-flop circuit interposed between the bit lines and the first logic circuit.

11. The semiconductor device of claim 7, wherein:

a third memory circuit, among the plurality of memory circuits, includes a third word line of the word lines and a third bit line corresponding to the third word line from among the bit lines, and the semiconductor device further comprises a second logic circuit receiving the result of the first logical operation and a third signal based on an output from the third bit line, performing a second logical operation based on the result of the first logical operation and the third signal, and outputting a result of the second logical operation.

12. The semiconductor device of claim 6, further comprising a pixel array connected to the plurality of memory circuits and comprising a plurality of photoelectric conversion elements configured to generate an analog signal from a subject light.

13. The semiconductor device of claim 12, further comprising an optical lens adjacent to the pixel array and configured to form the subject light on the pixel array.

14. The semiconductor device of claim 12, further comprising an analog-to-digital converter (ADC) circuit connected between the pixel array and the plurality of memory circuits and configured to convert the analog signal to a digital signal and to output the digital signal to the plurality of memory circuits.

15. The semiconductor device of claim 14, wherein the plurality of memory circuits are configured to store the digital signal received from the ADC circuit.

16. The semiconductor device of claim 14, wherein:

the digital signal comprises N bits, each of the plurality of memory circuits includes N memories arranged in the first direction, and N is natural number.

17. A memory circuit comprising:

an array of memory cells arranged in a matrix comprising rows, a first column, and a second column;

a first word line, extending in a first direction between the first column and the second column and connected to memory cells within the first column; and a first output line, extending in the first direction between the first column and the second column and connected to memory cells within a first row among the rows, that outputs a value stored by each of the memory cells within the first row.

18. The memory circuit of claim 17, further comprising:

wherein the array of memory cells arranged in the matrix further comprising a third column;

a second word line, extending in a first direction between the second column and the third column and connected to memory cells within the second column; and a second output line, extending in a first direction between the second column and the third column and connected to memory cells within a second row among the rows, that outputs a value stored by each of the memory cells within the second row.

19. The memory circuit of claim 18, wherein the first output line outputs a first value concurrently with the second output line outputting a second value, the first value stored by a first memory cell within the first row and the first column, the second value stored by a second memory cell within the second row and the first column.

20. The memory circuit of claim 19, wherein the first output line outputs the first value and a third value sequentially, the third value stored by a third memory cell within the first row and the second column.

* * * * *